(12) United States Patent
Noh et al.

(10) Patent No.: US 7,902,871 B2
(45) Date of Patent: Mar. 8, 2011

(54) LEVEL SHIFTER AND SEMICONDUCTOR DEVICE HAVING OFF-CHIP DRIVER

(75) Inventors: Yong-Hwan Noh, Hwaseong-si (KR); Chul-Sung Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/759,252

(22) Filed: Apr. 13, 2010

(65) Prior Publication Data

US 2010/0194433 A1 Aug. 5, 2010

Related U.S. Application Data

(62) Division of application No. 12/191,531, filed on Aug. 14, 2008, now abandoned.

(30) Foreign Application Priority Data

Aug. 17, 2007 (KR) .............................. 2007-0082745

(51) Int. Cl.
*H03K 19/0175* (2006.01)
(52) U.S. Cl. ................................ 326/81; 326/68; 326/80
(58) Field of Classification Search .................. None
See application file for complete search history.

(56) References Cited

U.S. PATENT DOCUMENTS

| 5,808,480 | A | 9/1998 | Morris |
| 6,268,755 | B1 | 7/2001 | Summerlin et al. |
| 6,696,860 | B2 * | 2/2004 | Lim et al. ........................ 326/83 |
| 7,183,817 | B2 * | 2/2007 | Sanchez et al. ............... 327/112 |
| 2006/0028245 | A1 | 2/2006 | Min et al. |
| 2007/0001716 | A1 | 1/2007 | Sanchez et al. |
| 2007/0008003 | A1 | 1/2007 | Boerstler et al. |
| 2008/0036522 | A1 | 2/2008 | Chung et al. |

FOREIGN PATENT DOCUMENTS

| JP | 09148913 A | 6/1997 |
| JP | 2001196918 A | 7/2001 |
| KR | 1020060013805 A | 2/2006 |

* cited by examiner

*Primary Examiner* — Anh Q Tran
(74) *Attorney, Agent, or Firm* — Volentine & Whitt, PLLC

(57) ABSTRACT

Provided are a level shifter and a semiconductor device having an OFF-chip driver (OCD) using the same. The level shifter includes a plurality of series connected logic gates receiving a first-state input signal having a first power supply voltage level and generating a level-shifted first-state output signal having a second power supply voltage level. The logic gates receive as power supply voltages at least one intermediate power supply voltage having at least one voltage level intermediate between the first power supply voltage level and the second power supply voltage level, and an intermediate power supply voltage applied to the present logic gate is equal to or higher than an intermediate power supply voltage applied to the previous logic gate.

6 Claims, 6 Drawing Sheets

US 7,902,871 B2

LEVEL SHIFTER AND SEMICONDUCTOR DEVICE HAVING OFF-CHIP DRIVER

CROSS REFERENCE TO RELATED APPLICATIONS

This is a divisional of application Ser. No. 12/191,531 filed on Aug. 14, 2008, which claims the benefit of Korean Patent Application No. 2007-0082745, filed Aug. 17, 2007. The subject matter of both of these applications is hereby incorporated by reference in their entirety.

SUMMARY OF THE INVENTION

The present invention relates generally to a level shifter and a semiconductor device including an OFF-chip driver (OCD) using the same. More particularly, the invention relates to a level shifter operating at high speed and with reduced noise, as well as a semiconductor device having such an OCD.

In one embodiment, the invention provides a level shifter including a boost logic element receiving an input signal at a level of the first power supply voltage and an intermediate power supply voltage, and generating an output signal, an output logic element receiving a second power supply voltage and the output of the boost logic element, and generating an output signal at a level of the second power supply voltage, wherein the level of the intermediate power supply voltage is between the level of the first power supply voltage and the level of the second power supply voltage.

In another embodiment, the invention provides a level shifter including; a boost logic element receiving an input signal at a level of the first power supply voltage and a first intermediate power supply voltage, and generating an output signal, an auxiliary logic element receiving the output signal of the boost logic element and a second intermediate power supply voltage, and generating an output signal, and an output logic element receiving the output of the auxiliary logic element and a second power supply voltage, and generating an output signal, wherein the respective levels of the first and second intermediate power supply voltages are between the level of the first power supply voltage and the level of the second power supply voltage.

In another embodiment, the invention provides a semiconductor device comprising an OFF-chip driver (OCD), including; a pull-up level shifter generating a level-shifted, first-state, data pull-up signal having a second power supply voltage level in response to first-state internal data having a first power supply voltage level, wherein the pull-up level shifter comprises a plurality of series connected pull-up logic gates receiving as power supply voltages at least one pull-up intermediate power supply voltage having at least one voltage level intermediate between the first power supply voltage level and the second power supply voltage level, the at least one pull-up intermediate power supply voltage of the pull-up logic gates having either a same voltage level or gradually increasing voltage levels, and a pull-up driver pulling up output data in response to the data pull-up signal and a pull-up control signal to output first-state output data having the second power supply voltage level.

DETAILED DESCRIPTION OF THE INVENTION

Semiconductor devices include a plurality of individual circuit blocks performing a variety of functions. Although most of the circuit blocks operate in relation to a particular voltage, some of the circuit blocks require one or more different voltages. A level shifter may be understood as an interface circuit of sorts connecting two or more circuits requiring different voltages within a semiconductor device. A level shifter either receives a low-voltage level signal and converts the low-voltage level signal into a high-voltage level signal output or receives a high-voltage level signal and converts the high-voltage level signal into a low-voltage level signal output. That is, when there is a difference in voltage level between signals transmitted to internal circuit blocks of a semiconductor device or signals transmitted to a semiconductor device and an external apparatus, the level shifter shifts a voltage level of a signal to compensate for the difference in voltage level.

The exemplary embodiments of the invention described hereafter will be better appreciated upon consideration of several conventional comparative examples that follow.

Figure (FIG.) 1 is a circuit diagram of a conventional level shifter which converts a low-level input signal IN into a high-level output signal OUT.

As used in the subject specification, the terms "low-voltage" and "high-voltage" are used to indicate alternate voltages distinguished by a non-trivial voltage difference, wherein a high-voltage level signal, voltage, or supply is greater than a corresponding low-voltage level signal, voltage or supply.

Figure 1:
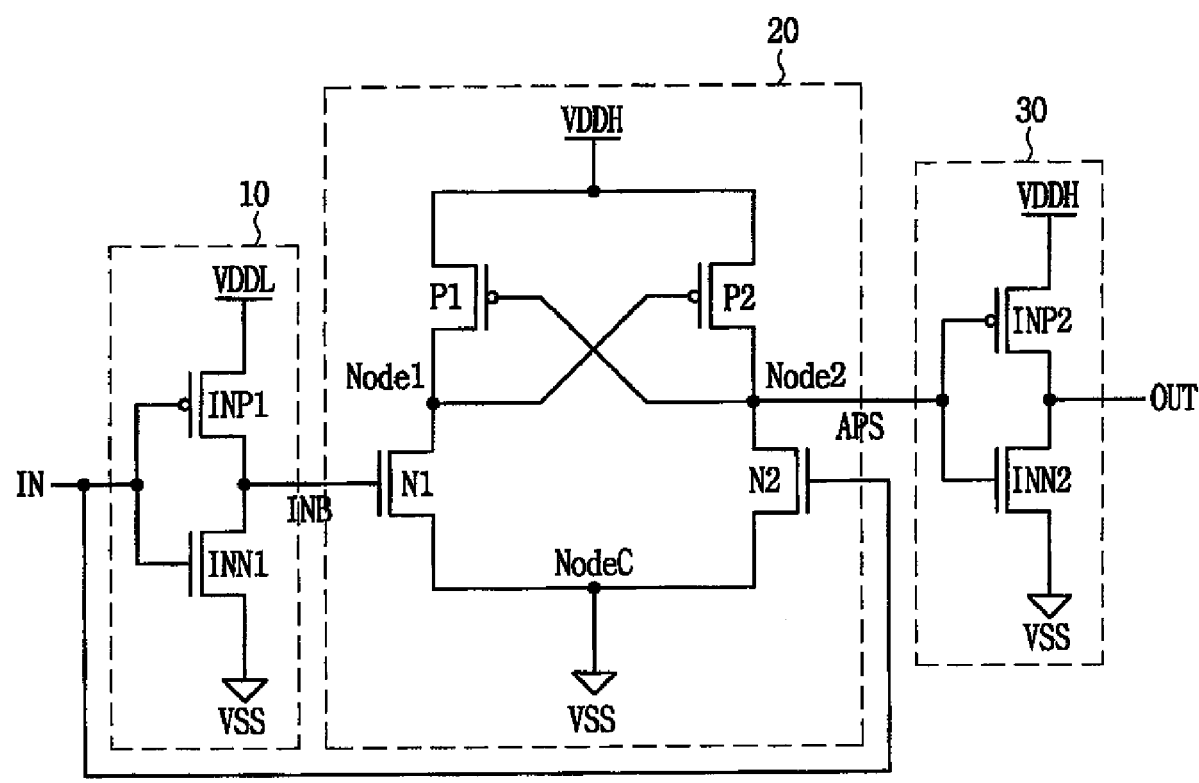
FIG. 1 is a circuit diagram of a conventional level shifter.

Referring to FIG. 1, the level shifter includes a first inverter 10, a second inverter 30, and an amplifier 20. First inverter 10 operates in response to a low-voltage level first power supply voltage VDDL and a ground voltage VSS, and amplifier 20 and second inverter 30 operate in response to a high-voltage level second power supply voltage VDDH and ground voltage VSS.

First inverter 10 includes a PMOS transistor INP1 and an NMOS transistor INN1 series connected between the first power supply voltage VDDL and ground voltage VSS and having gates receiving the low-voltage level input signal IN. An inverted input signal INB output by first inverter 10.

Amplifier 20 receives the input signal IN and the inverted input signal INB, senses and amplifies a voltage difference between the two applied signals, and outputs a high-voltage level boost signal APS. Amplifier 20 includes two PMOS transistors P1 and P2 and two NMOS transistors N1 and N2. NMOS transistor N1 is connected between a first node Node1 and ground voltage VSS and has a gate receiving the inverted input signal INB provided by first inverter 10. NMOS transistor N2 is connected between a second node Node2 and ground voltage VSS and has a gate receiving the input signal IN. Also, PMOS transistor P1 is connected between the second power supply voltage VDDH and the first node Node1 and has a gate receiving a voltage apparent at the second node Node2. PMOS transistor P2 is connected between the second power supply voltage VDDH and the second node Node2 and has a gate receiving the voltage apparent at the first node Node1. The boost signal APS output by amplifier 20 is communicated through the second node Node2 to second inverter 30. Since amplifier 20 is driven in response to the high-voltage level second power supply voltage VDDH and ground voltage VSS, the boost signal APS is higher than the input signal IN.

Second inverter 30 includes a PMOS transistor INP2 and an NMOS transistor INN2, series connected between the second power supply voltage VDDH and ground voltage VSS and having gates receiving the boost signal APS. Unlike first inverter 10, second inverter 30 is driven in response to the high-voltage level second power supply voltage VDDH. Accordingly, the output signal OUT provided by second inverter 30 is a high-voltage level signal.

In the conventional level shifter shown in FIG. 1, when the input signal IN is transited from a low level to a high level, first inverter 10—which is driven in response to the low-voltage level first power supply voltage VDDL, inverts the input signal IN and outputs an inverted input signal INB having low level. NMOS transistor N1 of amplifier 20 is turned OFF in response to the inverted input signal INB having low level, and NMOS transistor N2 of amplifier 20 is turned ON in response to the input signal IN having high level. Since NMOS transistor N2 is turned ON, the voltage signal of the second node Node2 is driven to low, and PMOS transistor P1 is turned ON in response to the low signal apparent at the second node Node2. When PMOS transistor P1 is turned ON, the second power supply voltage VDDH is applied to the first node Node1 so that the voltage signal apparent at the first node Node1 is driven high. PMOS transistor P2 is turned OFF in response to the high signal apparent at the first node Node1. Since the boost signal APS is output through the second node Node2, the boost signal APS is output at a low level. Second inverter 30 receives the boost signal APS having low level, inverts the boost signal APS, and outputs a high-voltage level output signal OUT having high level. Here, the output signal OUT has a high-voltage level because second inverter 30 is driven in response to the second power supply voltage VDDH. Thus, when the input signal IN makes the transition from a low level to a low-voltage high level, the output signal OUT makes the transition from a low level to a high-voltage high level. In other words, a level-shifted output signal OUT is output.

However, in the level shifter shown in FIG. 1, when the inverted input signal INB is transited from a high level to a low level, since PMOS transistor P1 remains OFF, the voltage signal apparent at the first node Node1 assumes a high-impedance state. The high-impedance state for the voltage signal apparent at the first node Node1 may be perceived as a high level signal after the second node Node2 has been completely discharged by NMOS transistor N2 in its ON state. Accordingly, PMOS transistor P1 is also turned ON. Also, the voltage level of the signal apparent at the second node Node2 will not is not be fully stable until PMOS transistor P2 is completely turned OFF in response to the voltage signal apparent at the first node Node1. Therefore, the level shifter shown in FIG. 1 will not operate at high-speeds due to this settling time requirement for the voltage apparent at the second node Node2. Furthermore, when the input signal IN makes a low-to-high transition or makes a high-to-low transition, it become indeterminate whether PMOS transistors P1 and P2 of amplifier 20 are turned ON or OFF. As a result, a large amount of current may flow through the first and second nodes Node1 and Node2. Since amplifier 20 consumes a large amount of current in a short amount of time, a high level of power noise occurs in the level shifter shown in FIG. 1. As the voltage difference between the first power supply voltage VDDL and the second power supply voltage VDDH increases, the level of this power noise only increases.

Figure 2:
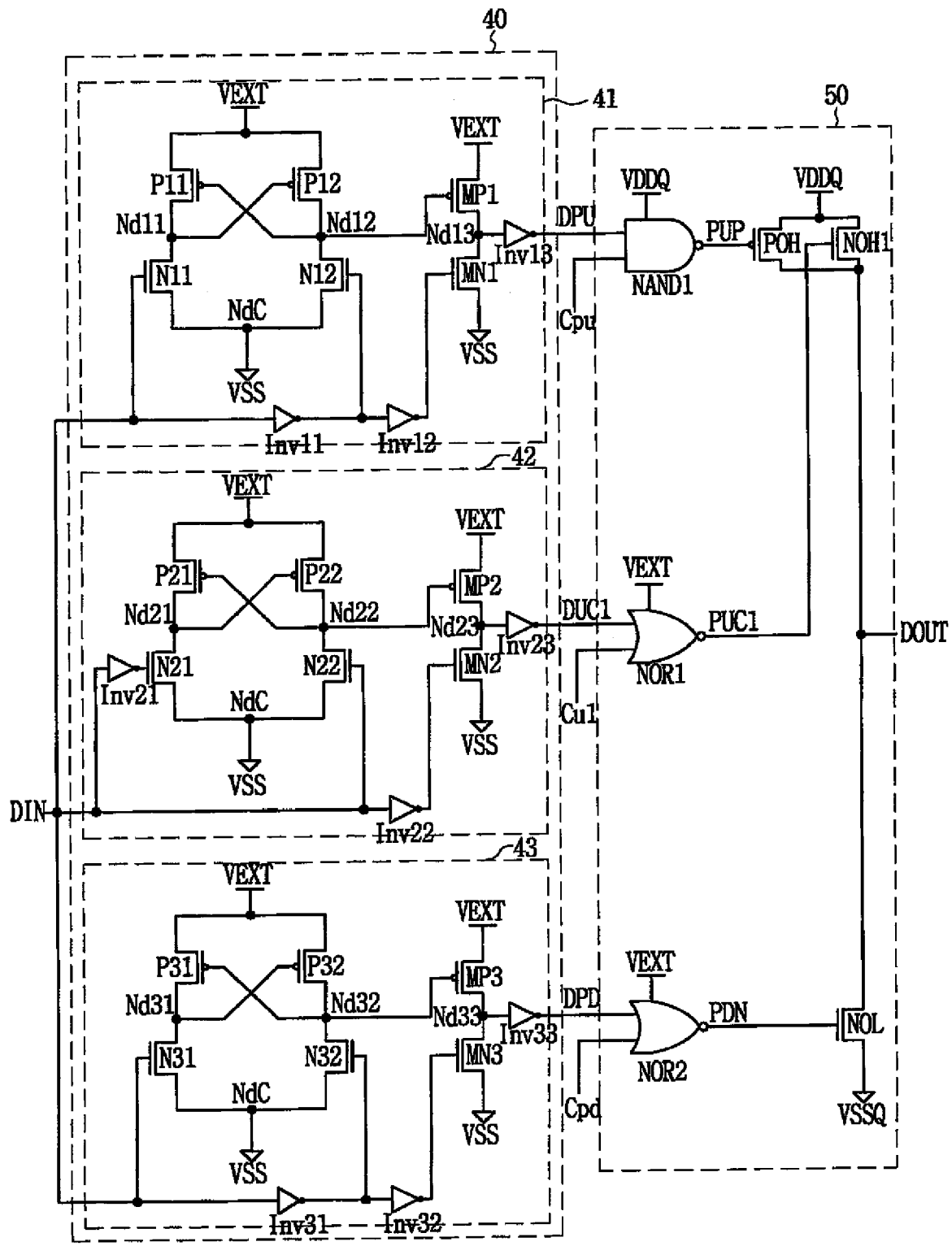
FIG. 2 is a circuit diagram of an OFF-chip driver using the level shifter shown in FIG. 1.

FIG. 2 is a circuit diagram of an OFF-chip driver (OCD) using the level shifter shown in FIG. 1.

There are few occasions when semiconductor devices are independently used. Most of the semiconductor devices transmit and receive a variety of signals to and from external apparatuses. However, a typical external apparatus requires a higher voltage than an associated semiconductor device. Further, with the development of deep sub-micron technology, the operating voltages associated with semiconductor devices have continuously been reduced so that the differences between the voltages operating contemporary semiconductor device and related external apparatus has only increased. Thus, in order for a semiconductor device to competently output a signal to an external apparatus, the semiconductor device must generally include an output driver that shifts the level of an internal signal into a signal appropriate for the external apparatus before outputting the level-shifted signal to the external apparatus. The output driver includes an OCD that controls the definition of the output signal in order to apply an output signal without distortion or undesirable signal reflection.

The OCD shown in FIG. 2 performs impedance matching on a single data signal. When a semiconductor device receives and transmits a plurality of data bits in parallel, a corresponding plurality of OCDs must be provided.

When the semiconductor device outputs internal data signal DIN having an internal voltage level to a corresponding external apparatus, the internal data DIN is applied to the OCD. The OCD includes a level shifter 40 and a data output unit 50. The level shifter 40 includes a plurality of level shift circuits 41 to 43 and outputs a data pull-up signal DPU, a data up signal DUC1, and a data pull-down signal DPD in response to the internal data DIN. Data output unit 50 controls the impedance of output data DOUT and outputs the controlled output data DOUT in response to the data pull-up signal DPU, the data up signal DUC1, the data pull-down signal DPD, a pull-up control signal Cpu, an up control signal Cu1, and a pull-down control signal Cpd. The pull-up control signal Cpu, the up control signal Cu1, and the pull-down control signal Cpd are output by a predriver (not shown) in order to control the impedance of the output data DOUT.

The internal data DIN is applied to level shifter 40 at an internal voltage level of the semiconductor device. Also, first through third level shift circuits 41 to 43 are driven in response to an external voltage VEXT received by the semiconductor device. The external voltage VEXT at a higher level than an internal operating voltage of the semiconductor device.

When the internal data DIN makes a low-to-high transition, in first level shift circuit 41, the internal data DIN is applied to the gate of an NMOS transistor N11, and internal data inverted by an inverter Inv11 is applied to the gate of an NMOS transistor N12. The NMOS transistor N11 is turned ON in response to the internal data DIN having high level, and the NMOS transistor N12 is turned OFF in response to the inverted internal data having low level. Thus, a voltage level of a node Nd11 drops, and a voltage level of a node Nd12 rises. A PMOS transistor P11 is turned OFF in response to the voltage level apparent at the node Nd12, while a PMOS transistor P12 is turned ON in response to the voltage level apparent at the node Nd11. Since a high level voltage is output through the second node Nd12, a PMOS transistor MP1 is turned OFF. Also, since the inverted internal data having low level, which is output by the inverter Inv11, is inverted again by an inverter Inv12 and applied at a high level to an NMOS transistor MN1, the NMOS transistor MN1 is turned ON. The PMOS transistor MP1 is turned OFF and the NMOS transistor MN1 is turned ON, so that a voltage level of a node Nd13 drops. An inverter Inv13 inverts the low voltage level of the node Nd13 and outputs the data pull-up signal DPU having high level.

Second level shift circuit 42 operates in the same manner as first level shift circuit 41 except that since NMOS transistors N21 and N22 receive inverted internal data and internal data DIN, respectively, a data up signal DUC1 is output at a low level.

Similarly, third level shift circuit 43 also operates in the same manner as first level shift circuit 41 and outputs a data pull-down signal DPD having high level.

Since the data pull-up signal DPU, the data up signal DUC1, and the data pull-down signal DPD are all signals of which levels are shifted by the first through third level shift circuits 41 to 43, respectively, when the data pull-up signal DPU, the data up signal DUC1, and the data pull-down signal DPD are at a high level, they are output at an external voltage (VEXT) level.

A NAND gate NAND1 of data output unit 50 receives the data pull-up signal DPU and the pull-up control signal Cpu, performs a logic NAND on the data pull-up signal DPU and the pull-up control signal Cpu, and outputs a pull-up signal PUP. A NOR gate NOR1 receives the data up signal DUC1 and the up control signal Cu1, performs a logic NOR on the data up signal DUC1 and the up control signal Cu1, and outputs an up driving control signal PUC1. A NOR gate NOR2 receives the data pull-down signal DPD and the pull-down control signal Cpd, performs a logic NOR on the data pull-down signal DPD and the pull-down control signal Cpd, and outputs a pull-down signal PDN. A pull-up transistor POH and an up drive transistor NOH1 control a high level voltage of output data DOUT in response to the pull-up signal PUP and the up driving control signal PUC1, respectively, and a pull-down transistor NOL controls a low level voltage of the output data DOUT in response to the pull-down signal PDN. Data output unit 50 operates in response to an internal voltage of the semiconductor device, an external voltage VEXT, a ground voltage, and additional data output power supply voltage VDDQ and data output ground voltage VSSQ in order to increase noise immunity of the output data DOUT.

When level shifter 40 outputs a data pull-up signal DPU having high level, a data up signal DUC1 having low level, and a data pull-down signal DPD having high level in response to the internal data DIN having high level, the NAND gate NAND1 of data output unit 50 outputs the pull-up signal PUP in response to the pull-up control signal Cpu, and the NOR gate NOR1 of data output unit 50 outputs the up driving signal PUC1 in response to the up control signal Cu1. However, the NOR gate NOR2 outputs a pull-down signal PDN having low level in response to the data pull-down signal DPD having high level irrespective of the pull-down control signal Cpd. Thus, the pull-down transistor NOL is turned OFF, and the output data DOUT is driven and output according to states of the pull-up transistor POH and the up drive transistor NOH1 that are turned ON or OFF in response to voltage levels of the pull-up signal PUP and the up driving signal PUC1.

As illustrated in FIG. 2, the conventional OCD includes only the pull-up transistor POH, the pull-down transistor NOL, and the up drive transistor NOH1 in order to drive the output data DOUT. However, when the output data DOUT must be driven more precisely, the OCD may further include an additional up transistor, which is connected in parallel to a pull-up transistor POH, and an additional down transistor, which is connected in parallel to a pull-down transistor NOL.

As described above, the OCD must include a plurality of level shifters in order to output data. Also, the OCD should include a larger number of level shifters in order to output a plurality of data bits in parallel. When the OCD incorporates conventional level shifters that consume high power, and operate at relatively low speed with high noise, the overall power consumption and noise increase in proportion to the increased number of the level shifters.

This is a considerable problem. Many contemporary electronic systems are being operated at ever increasing speeds, but with greater restrictions on power consumption. Thus, it has become necessary to develop level shifters that are capable of low-power, high-speed operation with reduced noise.

A level shifter and a semiconductor device including an OFF-chip driver (OCD) using the same according to embodiments of the invention will now be described more fully hereinafter with reference to the accompanying drawings.

Figure 3:
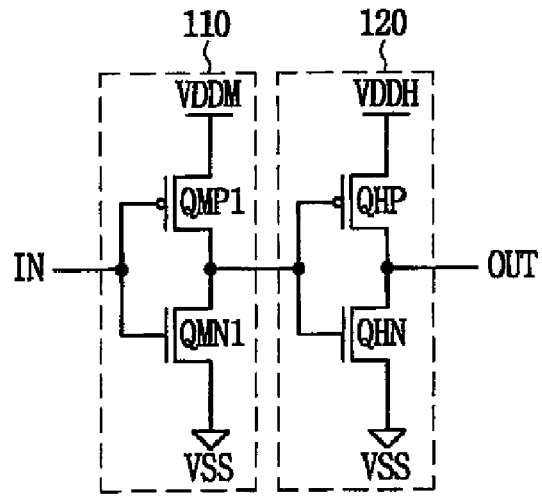
FIG. 3 is a circuit diagram of a level shifter according to an exemplary embodiment of the present invention.

FIG. 3 is a circuit diagram of a level shifter according to an embodiment of the invention.

Like the level shifter shown in FIG. 1, the level shifter shown in FIG. 3 receives an input signal IN having a first power supply voltage VDDL level, boosts the input signal IN to a second power supply voltage VDDH level, and outputs the boosted signal. The first power supply voltage VDDL is low-level, and the second power supply voltage VDDH is high-level (i.e., higher than the first power supply voltage VDDL).

The level shifter shown in FIG. 3 includes two inverters 110 and 120, as examples of "logic elements". A boost inverter 110 includes a PMOS transistor QMP1 and an NMOS transistor QMN1, series connected between an intermediate power supply voltage VDDM and ground voltage VSS and having gates receiving the input signal IN. Boost inverter 110 receives the input signal IN, inverts the input signal IN, and outputs an inverted input signal. The intermediate power supply voltage VDDM is at a higher level than the first power supply voltage VDDL, which is the voltage level of the input signal IN, and lower than that of the second power supply voltage VDDH, which is the voltage level of an output signal OUT. Here, a semiconductor device may further include an additional voltage regulator (not shown) so as to generate the intermediate power supply voltage VDDM.

An output inverter 120, which outputs the output signal OUT, includes a PMOS transistor QHP and an NMOS transistor QHN, series connected between the second power supply voltage VDDH and ground voltage VSS and having gates receiving the output signal provided by boost inverter 110.

When the input signal IN is applied at a low level (i.e., ground voltage VSS), PMOS transistor QMP1 of boost inverter 110 is turned ON, and NMOS transistor QMN1 of boost inverter 110 is turned OFF. The output signal of boost inverter 110 is output at the level of the intermediate power supply voltage VDDM that is applied through the turned-ON PMOS transistor QMP1. In output inverter 120, PMOS transistor QHP is turned OFF and the NMOS transistor QHN is turned ON in response to the intermediate power supply voltage VDDM level. Thus, the output signal OUT is output at ground voltage VSS applied through NMOS transistor QHN. In other words, the output signal OUT is output at a low level.

When the input signal IN is applied at a high level (i.e., first power supply voltage VDDL level), PMOS transistor QMP1 of boost inverter 110 is turned OFF, and NMOS transistor QMN1 of boost inverter 110 is turned ON. The output signal of boost inverter 110 is output at ground voltage VSS applied through the turned-on NMOS transistor QMN1. Also, in output inverter 120, PMOS transistor QHP is turned ON and NMOS transistor QHN is turned OFF in response to ground voltage VSS output by boost inverter 110. Thus, the output signal OUT is output at the level of the second power supply voltage VDDH applied through PMOS transistor QHP. In other words, the output signal OUT is level-shifted to a high level, that is, the second power supply voltage VDDH level, before being output.

Accordingly, since the level shifter shown in FIG. 3 includes only two inverters 110 and 120, the level shifter has a simpler configuration and is capable of operating at higher speeds than the conventional level shifter shown in FIG. 1. Also, the input signal IN having a low voltage level is not directly shifted to the output signal OUT having a high voltage level but indirectly shifted to the output signal OUT having the high voltage level through the intermediate power supply voltage VDDM, thereby causing a reduction in noise. Furthermore, the level shifter shown in FIG. 1 requires high power consumption due to a large current supplied to amplifier 20, while the level shifter shown in FIG. 3, which includes only boost inverter 110 and boost inverter 120, requires relatively low power consumption.

However, the level shifter shown in FIG. 3 requires a large current in a standby state. When the input signal IN is at a low level (i.e., ground voltage VSS) in the standby state, boost inverter 110 outputs a high-level signal. The high-level signal output by boost inverter 110 has the level of the intermediate power supply voltage VDDM. Thus, the PMOS transistor QHP having a source to which the second power supply voltage VDDH is applied is not completely turned OFF. As a result, a current is supplied to the PMOS transistor QHP and the NMOS transistor QHN.

Conversely, when the input signal IN has a high level (i.e., first power supply voltage VDDL) in the standby state, PMOS transistor QMP1 having a source to which the intermediate power supply voltage VDDM is applied is not completely turned OFF. As a result, a current is supplied to PMOS transistor QMP1 and NMOS transistor QMN1. As a result, current flows through the level shifter shown in FIG. 3 irrespective of whether the input signal IN is set at a high level or a low level in the standby state.

Figure 4:
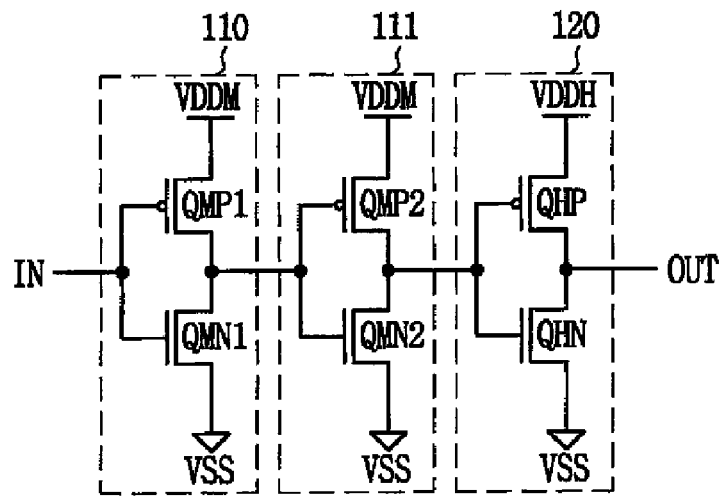
FIG. 4 is a circuit diagram of a level shifter according to another exemplary embodiment of the present invention.

FIG. 4 is a circuit diagram of a level shifter according to another embodiment of the invention which prevents the flow of current during a standby state.

The level shifter shown in FIG. 4 is generally the same as the level shifter shown in FIG. 3 except that an auxiliary inverter 111 is further included between boost inverter 110 and output inverter 120. Auxiliary inverter 111 includes a PMOS transistor QMP2 and an NMOS transistor QMN2 series connected between an intermediate power supply voltage VDDM and ground voltage VSS, and having gates to which an output signal of the boost inverter 110 is applied. Auxiliary inverter 111 receives the output signal of boost inverter 110 and outputs a signal to output inverter 120. Here, the intermediate power supply VDDM may be the same one applied to boost inverter 110 or another (first versus second) "intermediate power supply voltage greater than the intermediate power supply voltage applied to boost inverter 110 but less than the second power supply voltage."

In the level shifter including auxiliary inverter 111, when an input signal IN has a low level (i.e., ground voltage VSS) in the standby state, boost inverter 110 outputs a high-level signal. The high-level signal output by boost inverter 110 has a level of the intermediate power supply voltage VDDM. In response to the signal having the level of the intermediate power supply voltage VDDM output by boost inverter 110, PMOS transistor QMP2 of auxiliary inverter 111 is turned OFF, and NMOS transistor QMN2 of auxiliary inverter 111 is turned ON. Since the PMOS transistor QMP2 is completely turned OFF in response to the signal having the intermediate power supply voltage VDDM level, no current is supplied to the PMOS transistor QMP2. Also, no current is supplied to boost inverter 110 and output inverter 120 because NMOS transistors QMN1 and QHN of boost inverter 110 and output inverter 120 are completely turned OFF in response to a signal having the ground voltage VSS level. Therefore, when the input signal IN is set at a low level in the standby state, no current flows through the level shifter shown in FIG. 4.

However, the level shifter shown in FIG. 4 includes auxiliary inverter 111 so that the output signal OUT are opposite in phase to the output signal OUT of the level shifter shown in FIG. 3. However, when the output signal OUT must be equal in phase to the input signal IN, the level shifter shown in FIG. 4 may further include an output auxiliary inverter having the same configuration as output inverter 120 so as to invert the output signal OUT. Also, in FIGS. 3 and 4, a threshold voltage level of boost inverter 110 must be lower than the level of the first power supply voltage VDDL and a threshold voltage level of output inverter 120 must be lower than the level of the intermediate power supply voltage VDDM in order that the input signal IN may be stably level-shifted to the level of the second power supply voltage VDDH by boost inverter 110 and output inverter 120.

Figure 5:
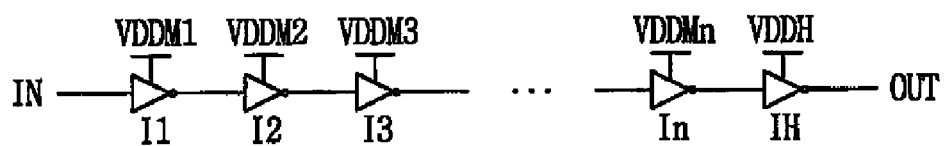
FIG. 5 is a circuit diagram of a level shifter according to another exemplary embodiment of the present invention.

FIG. 5 is a circuit diagram of a level shifter according to another embodiment of the invention which generalizes a level shifter according to the present invention.

When there is a great voltage difference between an input signal IN having a low voltage level and an output signal OUT having a high voltage level, the two-step level shifters shown in FIGS. 3 and 4 in which the input signal IN is boosted through an intermediate power supply voltage VDDM level to a second power supply voltage VDDH level may operate unstably due to the above-described conditions of the threshold voltage levels of inverters 110 and 120.

Therefore, when there is a great voltage difference between the input signal IN and the output signal OUT, the level shifter includes a plurality of inverters, which shift the level of the input signal IN by stages and output the output signal OUT so that the level shifter can operate stably.

The level shifter shown in FIG. 5 includes n+1 number of inverters I1 to In and IH so that the level shifter may shift the level of the input signal IN by n+1 stages and output the output signal OUT. A plurality of boost inverters I1 to In, which are connected in series, receive intermediate power supply voltages VDDM1 to VDDMn, respectively, which are intermediate between a first power supply voltage VDDL level (i.e., a voltage level of the input signal IN) and a second power supply voltage VDDH level (i.e., a voltage level of the output signal OUT). The intermediate voltages VDDM1 to VDDMn have sequentially increased voltage levels that are intermediate between the level of the first power supply voltage VDDL and the voltage of the second power supply voltage VDDH. A first boost inverter I1, which receives the input signal IN, receives a first intermediate voltage VDDM1 that is at a higher level than the first power supply voltage VDDL, and a second boost inverter I2 receives a second intermediate voltage VDDM2 that is at a higher level than the first intermediate voltage VDDM1. Similarly, each of the remaining boost inverters I3 to In receives an intermediate voltage that is at a higher level than an intermediate voltage applied to the previous inverter. Thus, an n-th intermediate voltage VDDMn applied to an n-th boost inverter In is at a higher level than an n−1-th intermediate voltage VDDMn−1 and at a lower level than the second power supply voltage VDDH.

However, each of the boost inverters I1 to In may not receive an intermediate voltage higher than an intermediate voltage applied to the previous boost inverter. In some cases, each of the boost inverters I1 to In may receive the same intermediate voltage as an intermediate voltage applied to the previous boost inverter.

An output inverter IH is driven in response to the second power supply voltage VDDH, inverts an output signal of an n-th boost inverter In, and outputs an output signal OUT having a second power supply voltage VDDH level.

Here, a plurality of intermediate voltages VDDM1 to VDDMn may be generated by an additional voltage regulator (not shown).

Accordingly, the level shifter shown in FIG. 5 boosts a voltage level of the input signal IN by stages through a plurality of inverters I1 to In to which gradually increasing intermediate voltages VDDM1 to VDDMn are applied and the output inverter IH to which the second power supply voltage VDDH is applied, and outputs the output signal OUT, thereby reducing noise.

Since the level shifter shown in FIG. 5 includes n+1 number of inverters, when n is an even number, the input signal IN is opposite in phase to the output signal OUT. For this reason, the level shifter shown in FIG. 5 includes an odd number of boost inverters I1 to In so that the input signal IN can be equal in phase to the output signal OUT.

Like in the level shifter shown in FIG. 3, a current may flow through the level shifter shown in FIG. 5 in a standby state. When a PMOS transistor included in each of the boost inverters I1 to In can be completely turned OFF in response to an output signal of the previous boost inverter due to a very small difference between two of the intermediate voltages VDDM1 to VDDMn, power is hardly consumed in the standby state. In this case, however, the level shifter shown in FIG. 5 must include a great number of boost inverters I1 to In, and the voltage regulator must generate a great number of intermediate voltages VDDM1 to VDDMn, thereby degrading the efficiency of the level shifter shown in FIG. 5. Therefore, like the level shifter shown in FIG. 4, the level shifter shown in FIG. 5 may include an auxiliary inverter corresponding to each of the boost inverters I1 to In and the input signal IN may be set at a low level in the standby state so that power consumption can be reduced.

Although all the level shifters shown in FIGS. 3 through 5 have been implemented in the illustrated examples using inverters, similar level shifters according to the present invention may be implemented using various CMOS logic gates, such as NAND gates and NOR gates, etc.

Figure 6:
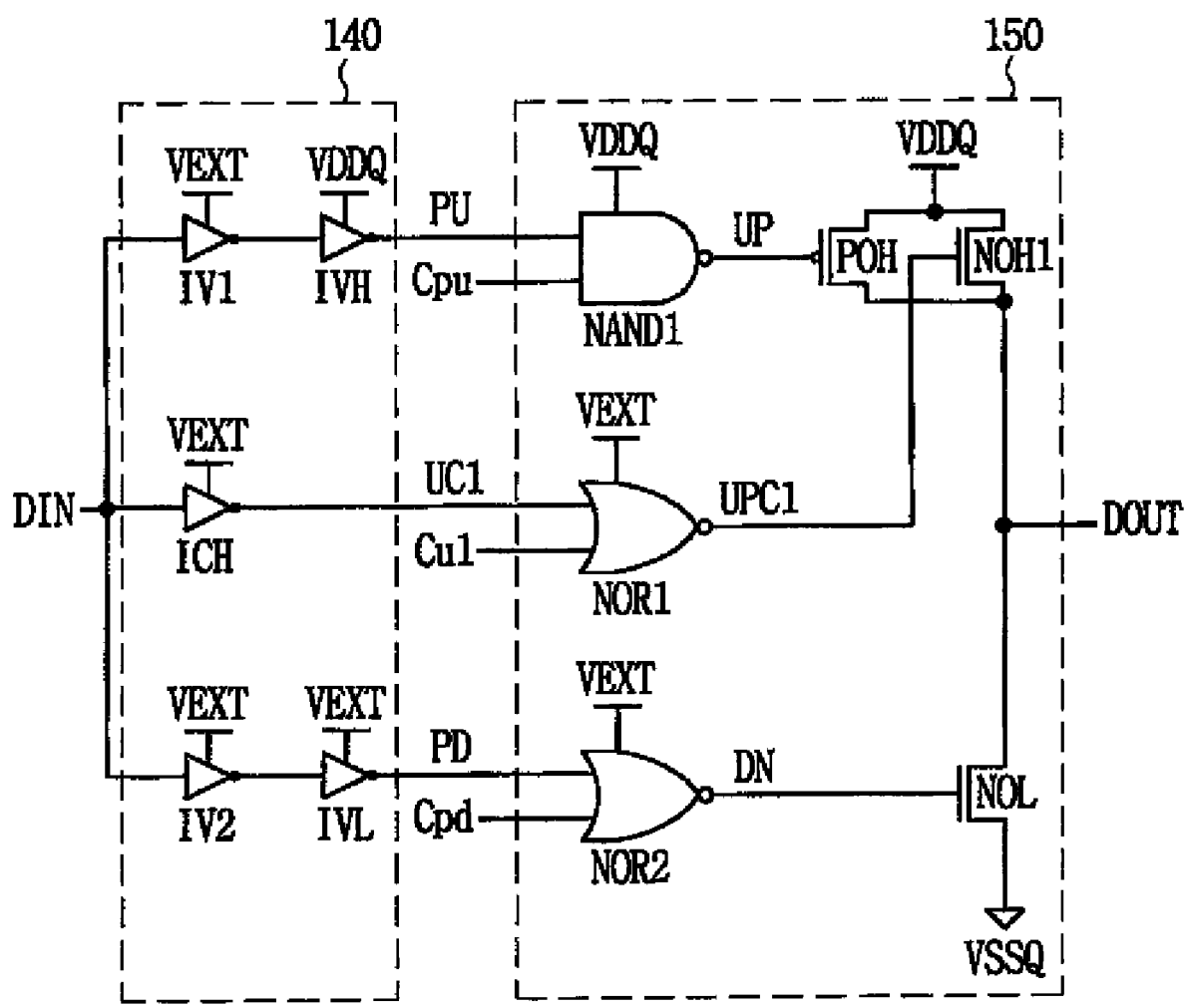
FIG. 6 is a circuit diagram of an OFF-chip driver (OCD) using a level shifter according to an exemplary embodiment of the present invention.

For example, FIG. 6 is a circuit diagram for an exemplary OCD using a level shifter according to another embodiment of the invention which is implemented using logic gates.

In the OCD shown in FIG. 6, since a data output unit 150 has the same configuration as data output unit 50 of FIG. 2, a description thereof will not be presented here. Also, unlike level shifter 40 shown in FIG. 2, a level shifter 140 shown in FIG. 6 includes only inverters IV1, IVH, ICH, IV2, and IVL.

Like in FIG. 2, the OCD shown in FIG. 6 performs impedance matching on a single data signal line. When a semiconductor device inputs and outputs a plurality of data in parallel, a plurality of OCDs must be provided accordingly. In the semiconductor device, when internal data DIN is applied to the OCD, the inverters IV1 and IVH corresponding to first level shifter 41 of FIG. 2 boost high-level internal data DIN to a data output power supply voltage VDDQ level and output a data pull-up signal PU. The inverter ICH corresponding to the second level shifter 42 shown in FIG. 2 boosts low-level internal data DIN to an external power supply voltage VEXT level and outputs a data up signal UC1. Also, inverters IV2 and IVL corresponding to third level shifter 43 shown in FIG. 2 boost high-level internal data DIN to the external power supply voltage VEXT level and output a data pull-down signal PD.

The data up signal UC1 and the data pull-down signal PD output by the level shifter 140 have the level of the external power supply voltage VEXT, while the data pull-up signal PU has the level of the output power supply voltage VDDQ, because data output unit 150 controls only the data pull-up signal PU to be at the output power supply voltage VDDQ level.

As compared with the level shifter shown in FIG. 2, level shifter 140 shown in FIG. 6 includes only the inverters IV1, IVH, ICH, IV2, and IVL so that level shifter 140 has a simple configuration, consumes less power, and operates at relatively higher speeds. A sharp difference between internal data DIN having an internal power supply voltage level and output data DOUT having a data output power supply voltage VDDQ level is reduced by level-shifting the internal data DIN to the output data DOUT through the external power supply voltage VEXT level that is intermediate between the internal power supply voltage level and the data output power supply voltage VDDQ level. As a result, noise is reduced.

Although the embodiment illustrated in FIG. 6 only shows the external power supply voltage VEXT used as an intermediate power supply voltage, the OCD may further include an additional voltage regulator and additional inverters to apply a larger number of intermediate power supply voltages. Those skilled in the art will understand that inverters may be replaced with NAND gates or NOR gates.

Also, in order to drive output data DOUT precisely, data output unit 150 may further include an additional up transistor, which is connected in parallel to a pull-up transistor POH, and an additional down transistor, which is connected in parallel to a pull-down transistor NOL.

Conversely, as long as the output data DOUT may be driven only by the pull-up transistor POH and the pull-down transistor NOL, the up transistor NOH1, the NOR gate NOR1, and the inverter ICH may be omitted.

Figure 7A:
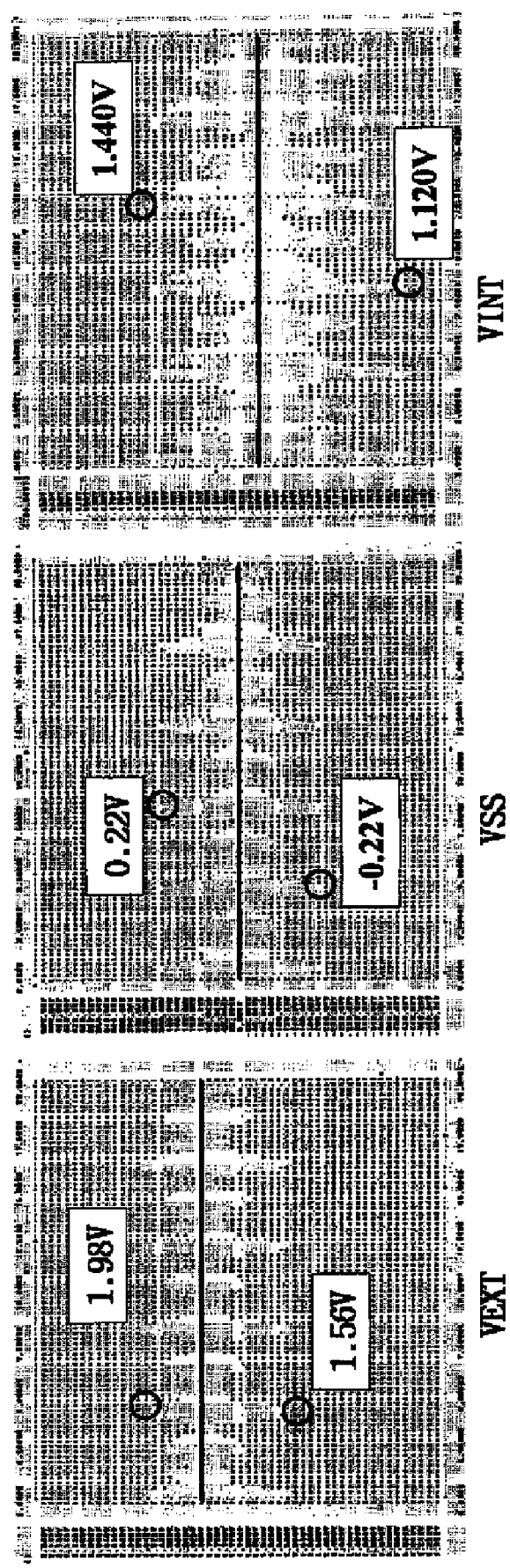
FIG. 7A is a graph of simulation results showing noise caused during a signal level shifting process in a conventional level shifter.
Figure 7B:
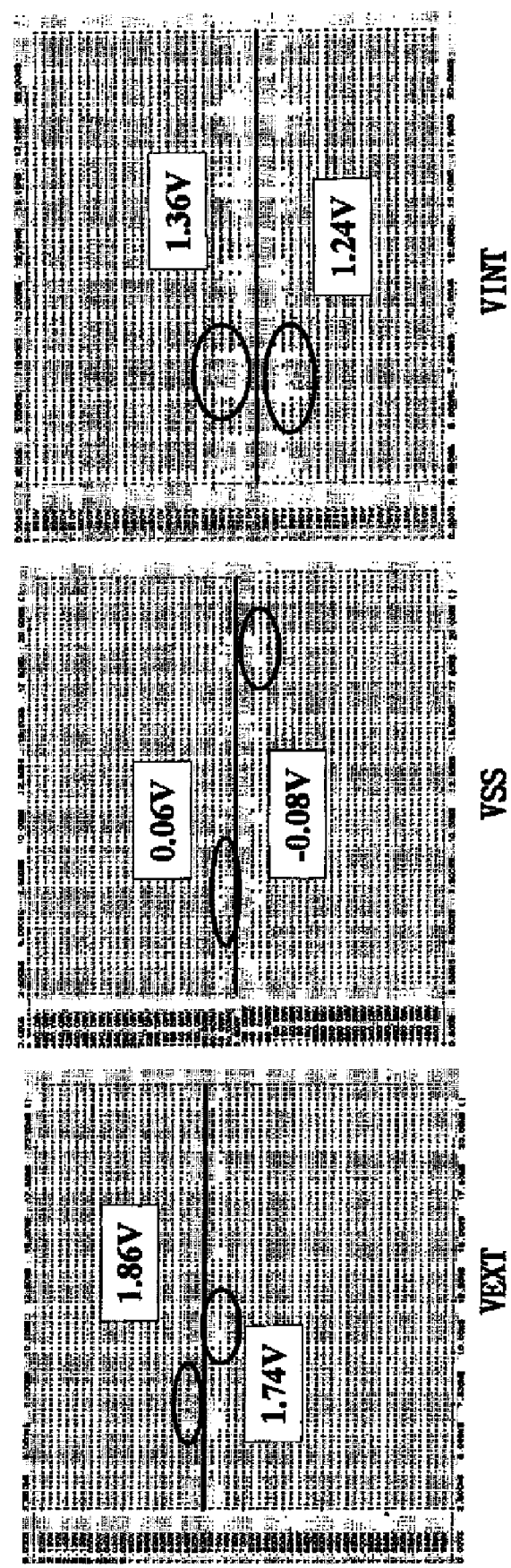
FIG. 7B is a graph of simulation results showing noise caused during a signal level shifting process in a level shifter according to an exemplary embodiment of the present invention.

FIG. 7A is a graph of simulation results showing power noise caused during a signal level shifting process when a semiconductor device includes a conventional level shifter, and FIG. 7B is a graph of simulation results showing power noise caused during a signal level shifting process when a semiconductor device includes a level shifter according to an embodiment of the invention. In FIGS. 7A and 7B, an abscissa denotes a time, and an ordinate denotes a voltage. Also, in FIGS. 7A and 7B, lines parallel to the abscissa denote reference voltages of an external power supply voltage VEXT, a ground voltage VSS, and an internal power supply voltage VINT. The external power supply voltage VEXT has a reference voltage of 1.8V, the ground voltage VSS has a reference voltage of 0V, and the internal power supply voltage VINT has a reference voltage of 1.35V.

Referring to FIG. 7A, when an input signal applied to the conventional level shifter varied, the external power supply voltage VEXT varied from 1.56V to 1.98V. That is, a power noise of 0.42V occurred. Also, as the ground voltage VSS varied from −0.22V to 0.22V, a power noise of 0.44V occurred. Furthermore, as the internal power supply voltage VINT varied from 1.12V to 1.44V, a power noise of 0.32V occurred.

Referring to FIG. 7B, as the external power supply voltage VEXT varied from 1.74V to 1.86V, a reduced power noise of 0.12V occurred. Also, as the ground voltage VSS varied from −0.08V to 0.06V, a reduced power noise of 0.14V occurred. Furthermore, as the internal power supply voltage VINT varied from 1.24V to 1.36V, a reduced power noise of 0.12V occurred.

Although not clearly shown in FIGS. 7A and 7B, a time taken to output an output signal in response to an input signal in a level shifter according to the present invention is reduced by 0.3 ns relative to the conventional level shifter.

According to certain embodiments of the present invention, a level shifter and a semiconductor device including an OCD using the same may be implemented using simple CMOS logic gates, such as inverters, so that power consumption and power noise are reduced and operating speed increased.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the scope of the present invention as set forth in the following claims.

What is claimed is:

1. A semiconductor device comprising an OFF-chip driver (OCD), comprising:
 a pull-up level shifter generating a level-shifted, first-state, data pull-up signal having a second power supply voltage level in response to first-state internal data having a first power supply voltage level, wherein the pull-up level shifter comprises a plurality of series connected pull-up logic gates receiving as power supply voltages at least one pull-up intermediate power supply voltage having at least one voltage level intermediate between the first power supply voltage level and the second power supply voltage level, the at least one pull-up intermediate power supply voltage of the pull-up logic gates having either a same voltage level or gradually increasing voltage levels;
 a pull-up driver pulling up output data in response to the data pull-up signal and a pull-up control signal to output first-state output data having the second power supply voltage level;
 a pull-down level shifter generating a level-shifted, first-state, data pull-down signal having a third power supply voltage level in response to the first-state internal data having the first power supply voltage level, the pull-down level shifter comprising a plurality of series connected pull-down logic gates receiving as power supply voltages at least one pull-down intermediate power supply voltage having at least one voltage level intermediate between the first power supply voltage level and the third power supply voltage level, the at least one pull-down intermediate power supply voltage of the pull-down logic gates having either a same voltage level or gradually increasing voltage levels; and
 a pull-down driver pulling down the output data in response to the data pull-down signal and a pull-down control signal to output second-state output data having a fourth power supply voltage level.

2. The device of claim 1, further comprising:
 at least one up level shifter generating at least one level-shifted first-state data up signal having the third power supply voltage level in response to the first-state internal data having the first power supply voltage level, each up level shifter comprising a plurality of series connected logic gates receiving as power supply voltages at least one up intermediate power supply voltage having at least one voltage level intermediate between the first power supply voltage level and the third power supply voltage level, the at least one up intermediate power supply voltage of the up logic gates having either a same voltage level or gradually increasing voltage level; and
 an up driver controlling a voltage level of the first-state output data in response to the at least one data up signal and the at least one up control signal corresponding to the at least one data up signal.

3. The device of claim 2, further comprising:
 at least one down level shifter generating at least one level-shifted, first-state, data down signal having the third power supply voltage level in response to the first-state internal data having the first power supply voltage level, each down level shifter comprising a plurality of series connected down logic gates receiving as power supply voltages at least one down intermediate power supply voltage having at least one voltage level intermediate between the first power supply voltage level and the third power supply voltage level, the at least one down intermediate power supply voltage of the down logic gates having either a same voltage level or gradually increasing voltage levels; and
 a down driver controlling a voltage level of the second-state output data in response to the at least one data down signal and the at least one down control signal corresponding to the at least one data down signal.

4. The device according to claim 3, wherein the pull-up, pull-down, up, and down level shifters further comprise a plurality of auxiliary logic gates respectively corresponding to the pull-up, pull-down, up, and down logic gates, each auxiliary logic gate interposed between two adjacent ones of the pull-up, pull-down, up, and down logic gates.

5. The device according to claim 4, further comprising:
 a voltage regulator generating the pull-up, pull-down, up, and down intermediate power supply voltage.

6. The device according to claim 5, further comprising:
 a pre-driver generating the pull-up control signal, the pull-down control signal, the at least one up control signal, and the at least one down control signal in response to the internal data to control impedance of the output data.

* * * * *